United States Patent
Herterich et al.

(10) Patent No.: US 12,019,102 B2
(45) Date of Patent: *Jun. 25, 2024

(54) METHOD FOR DETERMINING ASYMMETRIC VIBRATIONS IN AN ELECTRIC DEVICE

(71) Applicant: Siemens Energy Global GmbH & Co. KG, Munich (DE)

(72) Inventors: Holger Herterich, Nuremberg (DE); Franz Klammler, Passail (AT); Ruediger Kutzner, Zirndorf (DE); Harald Mayer, Roethenbach an der Pegnitz (DE); Mario Scala, Graz (AT); Marc Weber, Nuremberg (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 242 days.

This patent is subject to a terminal disclaimer.

(21) Appl. No.: 17/613,177

(22) PCT Filed: Apr. 21, 2020

(86) PCT No.: PCT/EP2020/061039
§ 371 (c)(1),
(2) Date: Nov. 22, 2021

(87) PCT Pub. No.: WO2020/233922
PCT Pub. Date: Nov. 26, 2020

(65) Prior Publication Data
US 2022/0236305 A1     Jul. 28, 2022

(30) Foreign Application Priority Data
May 20, 2019 (DE) .................... 10 2019 207 358.1

(51) Int. Cl.
*G01R 19/00*     (2006.01)
*H04W 4/38*     (2018.01)

(52) U.S. Cl.
CPC .......... *G01R 19/0015* (2013.01); *H04W 4/38* (2018.02)

(58) Field of Classification Search
CPC .......................... G01R 19/0015; H04W 4/38
See application file for complete search history.

(56) References Cited

U.S. PATENT DOCUMENTS

2017/0227592 A1    8/2017   Berler et al.
2019/0145932 A1*   5/2019   Feng .................... G01N 29/043
                                                                                       324/226

(Continued)

FOREIGN PATENT DOCUMENTS

CN     106199226 A    12/2016
CN     106291164 A     1/2017

(Continued)

OTHER PUBLICATIONS

Translation of CN 106291164 A (Year: 2017).*

(Continued)

*Primary Examiner* — Paresh Patel
(74) *Attorney, Agent, or Firm* — Laurence A. Greenberg; Werner H. Stemer; Ralph E. Locher

(57) ABSTRACT

A method for determining a direct current component in an electric device that is connected to a high-voltage supply network. The method includes the following steps: acquiring operating noises of the electric device with the aid of acoustic sensors that are part of a portable unit and that provide acoustic signals at the output; breaking the acoustic signals down into their frequency components by a Fourier transformation, yielding a frequency spectrum; determining odd and even frequency components of the frequency spectrum in dependence upon a basic frequency of the high-voltage supply network and setting them in a ratio to one (Continued)

another; concluding that a direct current component is present if the ratio exceeds a predefined threshold value.

6 Claims, 1 Drawing Sheet

(56) References Cited

U.S. PATENT DOCUMENTS

| | | | | |
|---|---|---|---|---|
| 2020/0317237 A1* | 10/2020 | Mbuy | ................... | H01F 27/402 |
| 2022/0294262 A1* | 9/2022 | Herterich | ................ | G01R 31/62 |
| 2023/0053836 A1* | 2/2023 | Hamberger | ............... | H02J 3/26 |

FOREIGN PATENT DOCUMENTS

| | | | | |
|---|---|---|---|---|
| EP | 2905627 A1 | 8/2015 | | |
| WO | WO-2019201451 A1 * | 10/2019 | ............. | G01R 31/62 |

OTHER PUBLICATIONS https://www.mpx-easystar.de/forum/index.php?thread/8847-rc-speedo-hkdoppler-geschwindigkeitsmessung-von-flugmodellen-mit-dem-smartphone/ ; Doc Medicus Geschwindigkeitsmessung mit dem Smartphone; 2012, Three pages.

* cited by examiner

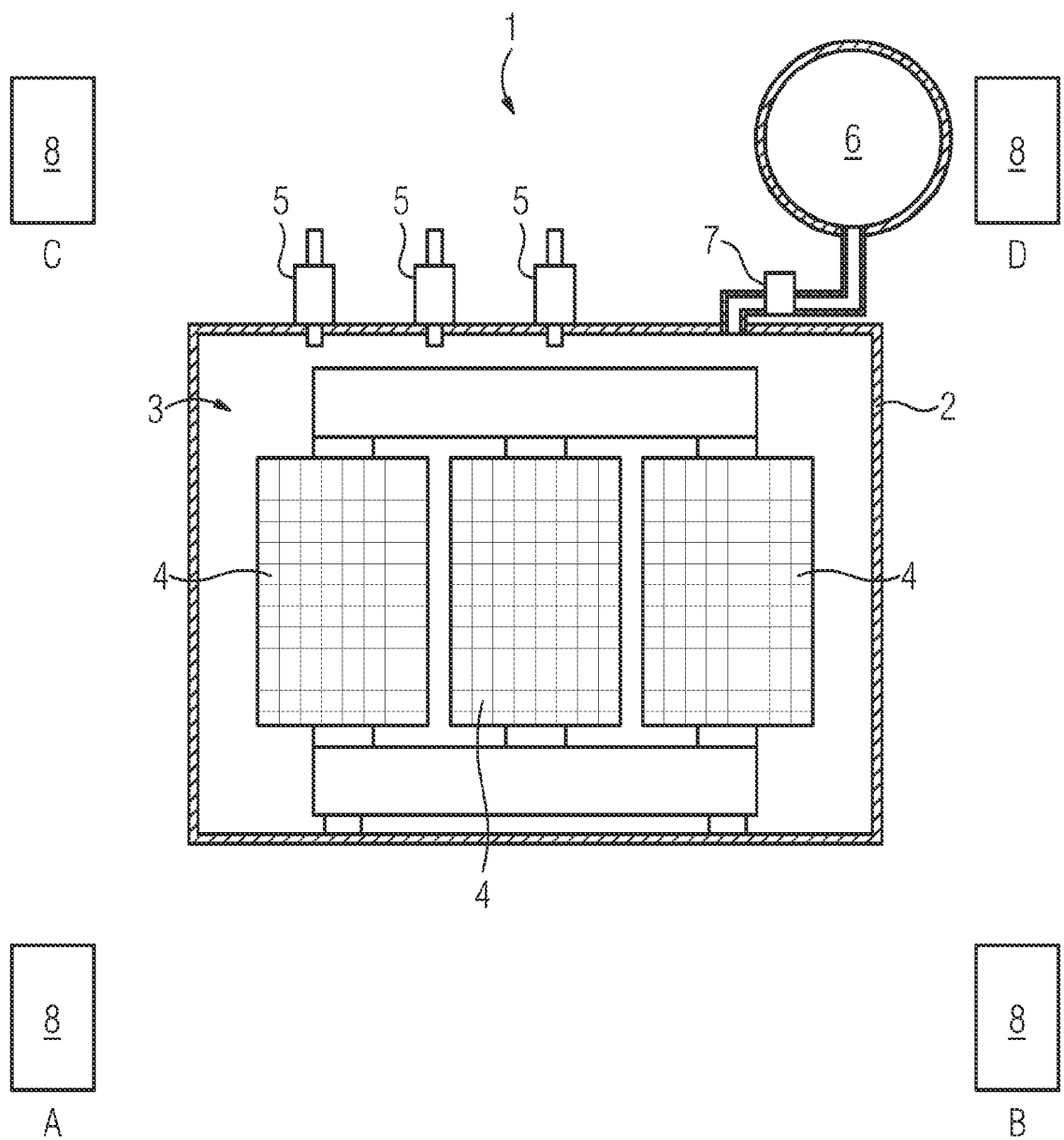

METHOD FOR DETERMINING ASYMMETRIC VIBRATIONS IN AN ELECTRIC DEVICE

FIELD AND BACKGROUND OF THE INVENTION

The invention relates to a method for identifying a DC current component in an electrical device.

In electrical transformers, as are used in energy transmission and distribution grids, an undesired infeed of a DC current, for example into the windings, may occur. Power electronics components in the grid, for example the actuation of electric drives, converters for flexible AC transmission systems or high-voltage DC current transmission, may also create DC currents in the electrical device. Another cause may be what are known as "geomagnetically induced currents" (hereinafter also referred to as GIC for short).

A DC current component in the core of the transformer results in a magnetic DC flux component that is overlaid on the AC flux. This results in asymmetric modulation of the magnetic material in the core, which entails a number of disadvantages. Even a DC current of a few amperes leads to saturation of the core with magnetic flux. This is associated with a significant increase in losses in the core (for example: 20-30%). Heating problems may occur in particular in the case of large GIC. Furthermore, during operation, there is increased noise emission, which is perceived to be particularly disruptive in particular when the transformer is installed close to a residential area.

Various apparatuses with an active and passive effect are known for the purpose of DC current compensation or reducing operating noise of a transformer as electrical device. Before expensive DC current compensation measures are taken, however, it is necessary to be certain as to whether such a DC current component is actually present.

SUMMARY OF THE INVENTION

The object of the invention is therefore to provide a method of the type mentioned at the outset by way of which it is easily, quickly and reliably possible to identify whether DC current components are occurring during operation of the electrical device in an electricity supply grid carrying a high voltage.

The invention achieves this object by acquiring the vibration of the core and the operating noise of the electrical device caused thereby with the aid of acoustic sensors that provide acoustic signals at output, breaking the acoustic signals down into their frequency components by way of a Fourier transformation so as to obtain a frequency spectrum, ascertaining even and odd frequency components of the frequency spectrum on the basis of a fundamental frequency of the AC voltage of the high-voltage supply grid and setting them in a ratio R to one another and concluding as to the presence of a DC current component when the ratio R exceeds a predetermined threshold value, wherein the acoustic sensors are part of a portable unit.

According to the invention, a portable unit may be used to quickly, easily and very reliably identify whether DC current components are occurring in an electrical device, such as for example a power transformer, during operation. Up until now, DC currents were evidenced using complex electrical measurements or series of acoustic measurements on the electrical device. The measured data had to be analyzed by experts. In other words, the previously known methods entailed high costs. The method according to the invention, on the other hand, is not only inexpensive, but may furthermore easily be implemented without the need for particular specialist knowledge. It is therefore able to be performed by any users, for example the operators of the electrical device.

During operation of the electrical device, this is connected to a high-voltage grid in the context of the invention. The electrical device is therefore designed for high voltages, and is for example a transformer or a reactor.

In mathematical terms, the method according to the invention may be described as follows. Let $S_x N$ be the signal value of the frequency spectrum in arbitrary units, wherein x stands for even (x=g), odd (x=u) or noise (x=n). N is the ordinal number of the signal, wherein N=1 corresponds to the fundamental and N=2, 3, 4, . . . , Nmax corresponds to the harmonics. Even frequencies $f_{gN}$ arise in the case of a supply voltage of 50 Hz in accordance with $f_{gN}=50*2*N$. Odd frequencies arise in accordance with $f_{uN}=50*(2*N+1)$. A DC current component in the electrical device causes an additional odd component on the overall spectrum. If the sum of all of the odd components on the overall spectrum is then set in a ratio R to the even components on the overall spectrum and this ratio R exceeds a previously defined threshold value, it is possible to conclude as to the presence of an interfering DC current component. The size of R expresses the effect of the DC current component on the core.

In one preferred embodiment of the method according to the invention, the portable unit is a mobile telephone. What is known as a "smartphone" is particularly well-suited as mobile telephone. Smartphones may generally be considered to be high-performance mobile telephones.

Mobile telephones are usually already equipped with a microphone as acoustic sensor. A mobile telephone furthermore has a memory and a programmable unit, for example at least one processor. The entire method according to the invention may be performed on the mobile telephone. In this case, what is known as an application, an app, that is to say a software package, is used. The app may advantageously be downloaded from what is known as a cloud. Additionally purchasing hardware to perform the method according to the invention has become necessary in the context of the invention. The mobile telephone acquires for example the noise of a transformer and performs a Fourier transformation on the time-resolved digital acoustic signals. The resultant spectrum is stored for example in a storage unit of the mobile telephone. The even and odd components are then investigated, and then weighted and summed. Finally, the ratio R is formed, as already described.

The mobile telephone advantageously has a storage unit in which the acoustic signals or the frequency spectrum are stored.

The entire method is preferably performed on a mobile telephone. The person applying the method thereby requires only the application software, which he is able to download from the cloud.

The acoustic signals are preferably acquired at different locations close to the electrical device. For this purpose, the user records the noise of the electrical device at different positions or measurement locations, for example in front of, next to and behind the electrical device. An average of the performed measurements is then formed for all of the frequency components from the respectively obtained spectra. Software preferably in this case guides the user interactively, so that the correct steps are able to be performed at the correct time.

The acoustic signals are advantageously acquired over a predefined duration. The duration is preferably in the range between 10 and 60 seconds for each measurement.

The mobile device is advantageously able to be connected to a cloud via a long-range communication connection.

The connection to the cloud is made via a long-range communication connection. To set this up, the portable unit, for example the mobile telephone, has a long-range communication apparatus, such as for example a mobile radio module in accordance with the GPRS or UMTS standard. This is used to establish a long-range communication connection, preferably an IP-based data connection, with the cloud. In this case, for example, a provider of a mobile radio service or a telecommunications provider may be interposed, and the long-range communication connection may be set up at least partially via a communication network of this provider and/or at least partially via the Internet. Only very little configuration and parameterization effort is then needed to set up the connection. Other than the configuration of the long-range communication apparatus with the information required to establish the long-range communication connection, for example the installation of a SIM card of a telecommunications provider, no further expenditure needs to be made for the individual communication unit.

A cloud or data connection cloud should be understood here to mean an arrangement containing one or more data storage apparatuses and one or more data processing apparatuses that may be designed, through suitable programming, to perform any desired data processing processes. The data processing apparatuses in this case generally constitute universal data processing apparatuses, such as for example servers, that initially do not have any specific design in terms of their construction and their programming. The universal data processing apparatus may be given the ability to perform specific functions only through programming that is undertaken.

If the cloud has multiple individual components, these are connected to one another in a manner suitable for data communication, for example through a communication network. A data processing cloud may be supplied with any desired data for data storage and/or processing purposes. The data processing cloud itself in turn makes the stored data and/or the events of the data processing that is performed available to other devices, for example computer workstations connected to a data processing cloud, laptops and smartphones. A data processing cloud may for example be provided by a data center or else a plurality of networked data centers. A data processing cloud is usually designed in a manner spatially remote from the high-voltage devices.

The electrical device, in the context of the invention, is designed for operation in the voltage or high-voltage grid, that is to say for an operating voltage between 1 kV and 1200 kV, in particular 50 kV and 800 kV. The high-voltage grid is preferably an AC voltage grid. However, a combination of AC and DC voltage grid is also possible in the context of the invention.

According to the invention, an electrical device is for example a transformer, in particular power transformer, a reactor or the like.

Further expedient embodiments and advantages of the invention are the subject matter of the following description of exemplary embodiments of the invention with reference to the FIGURE of the drawing, with the same reference signs referring to functionally identical components, and wherein the

BRIEF DESCRIPTION OF THE FIGURE

FIGURE schematically illustrates one exemplary embodiment of the method according to the invention.

DETAILED DESCRIPTION OF THE INVENTION

The FIGURE shows one exemplary embodiment of the method according to the invention, in which a transformer 1 is schematically illustrated as electrical device. The transformer 1 has a tank 2 that is filled with an insulating fluid. A magnetizable core 3 is arranged in the tank and forms a closed magnetic circuit. The limbs of the core 3 are each enclosed by two windings arranged concentrically to one another, only the outer high-voltage winding 4 of which is able to be seen. The windings are connected to the phases of a high-voltage grid carrying an AC voltage via bushings 5.

An expansion vessel 6 is used to compensate for temperature-induced volume fluctuations of the insulating fluid in the tank 2 of the transformer 1. A Buchholz relay 7 is able to be seen in the connecting line between the tank 2 and expansion vessel 6.

The FIGURE furthermore shows a mobile telephone 8, likewise illustrated only schematically, by way of which the operating noise of the transformer 1 is acquired at four different locations A, B, C and D. To this end, the mobile telephone 8 contains software or an "app" that asks the person applying the method to perform the noise measurement over a predefined duration and then to change location in order to perform the measurement again there.

A microphone, not illustrated in the FIGURE and already installed in the mobile telephone, is used for the noise measurement. The mobile telephone 8 stores the time-resolved acoustic signals generated by its microphone based on the measurement, after they have been digitized, in its storage unit, likewise not shown. The software then performs a Fourier transformation. This is followed by the formation of the ratio R, as already described above.

From the size of R, the method according to the invention derives whether and possibly to what order of magnitude the transformer is impacted by a DC current component. The user, by virtue of the result of the method, gains knowledge thereof and is then able to initiate appropriate countermeasures in order to suppress the possibly identified DC current component.

The sensors A and B are for example buried in the ground, and the measurements at the positions C and D take place in the high-voltage range. The measurements take place here for example roughly halfway up the tank (the windings).

The invention claimed is:

1. A method for identifying a DC current component in an electrical device that is connected to a high-voltage supply grid, the method comprising:
   providing a portable unit with at least one acoustic sensor;
   acquiring acoustic signals at different locations in a vicinity of the electrical device with the at least one acoustic sensor, wherein a software interactively guides a user during the acquiring step and wherein the acoustic signals capture operating noise of the electrical device;
   breaking down the acoustic signals into frequency components by way of a Fourier transformation to obtain a frequency spectrum;
   ascertaining even and odd frequency components of the frequency spectrum based on a fundamental frequency of the high-voltage supply grid and determining a ratio R between the odd and even frequency components; and when the ratio R exceeds a predetermined threshold value, concluding that a DC current component is present in the electrical device.

2. The method according to claim 1, wherein the portable unit is a mobile telephone.

3. The method according to claim 2, wherein the mobile telephone has a storage unit, and the method further comprises storing the acoustic signals or the frequency spectrum in the storage unit.

4. The method according to claim 1, which comprises performing the entire method on a mobile telephone.

5. The method according to claim 1, which comprises acquiring the acoustic signals over a predefined duration.

6. The method according to claim 1, wherein the portable unit is configured for connection to a cloud via a long-range communication connection.

* * * * *